United States Patent [19]

Koh

[11] Patent Number: 5,596,536
[45] Date of Patent: Jan. 21, 1997

[54] REDUNDANCY CIRCUIT

[75] Inventor: Hwa S. Koh, Kyoungki-do, Rep. of Korea

[73] Assignee: Hyundai Electronics Industries Co., Ltd., Kyoungki-Do, Rep. of Korea

[21] Appl. No.: 506,370

[22] Filed: Jul. 24, 1995

Related U.S. Application Data

[63] Continuation of Ser. No. 174,048, Dec. 28, 1993, abandoned.

[30] Foreign Application Priority Data

Dec. 30, 1992 [KR] Rep. of Korea ............... 92-26727

[51] Int. Cl.$^6$ .................... G11C 29/00; G11C 7/00
[52] U.S. Cl. ............ 365/200; 365/230.03; 365/225.7
[58] Field of Search .................. 365/200, 201, 365/230.03, 230.06, 189.01, 96, 225.7

[56] References Cited

U.S. PATENT DOCUMENTS

| | | | |
|---|---|---|---|
| 4,757,474 | 7/1988 | Fukushi et al. | 365/230.03 |
| 5,046,046 | 9/1991 | Sweha et al. | 365/200 |
| 5,060,197 | 10/1991 | Park et al. | 365/200 |
| 5,083,294 | 1/1992 | Okajima | 365/230.03 |
| 5,243,570 | 9/1993 | Saruwatari | 365/230.06 |
| 5,293,348 | 3/1994 | Abe | 365/200 |
| 5,307,316 | 4/1994 | Takemae | 365/230.03 |
| 5,404,331 | 4/1995 | McClure | 365/201 |

*Primary Examiner*—Tan T. Nguyen

[57] ABSTRACT

A redundancy circuit selectively drives two or more redundancy memory cell arrays to improve the integration of a highly integrated semiconductor memory device. To do this, the redundancy circuit has at least two memory blocks, each having a plurality of normal memory cell arrays and a redundancy memory cell array for replacing a defective memory cell array, at least two redundancy cell array drivers respectively connected to at least two redundancy memory cell arrays for driving at least two redundancy memory cell arrays, a defective-cell-array detection fuse box for detecting address corresponding to a defective memory cell array, and a driving controller for driving one of at least two redundancy cell array drivers by outputs of the defective-cell-array detection fuse box and the block selection fuse box.

6 Claims, 3 Drawing Sheets

REDUNDANCY CIRCUIT

BACKGROUND OF THE INVENTION

This is a continuation of application Ser. No. 08/174,048, filed on Dec. 28, 1993, abandoned.

FIELD OF THE INVENTION

The present invention relates to a redundancy circuit of a highly integrated semiconductor memory device, and more particularly to a redundancy circuit that can improve integration of the semiconductor memory device.

DESCRIPTION OF THE PRIOR ART

Highly integrated semiconductor devices such as DRAM-(Direct Random Access Memory), SRAM(Static Random Access Memory) and Pseudo SRAM have a plurality of divided memory blocks due to the power consumption and the increase in capacitance impedance of word line. The memory block has a plurality of memory cell arrays and at least one redundancy cell array for replacing defective memory cell array among the plurality of memory cell arrays. The highly integrated semiconductor memory device has redundancy circuits, as many as the redundancy memory cell arrays, respectively connected to said at least one redundancy memory cell array, to drive the redundancy memory cell array instead of the defective memory cell array. However, the number of defective memory cell arrays generated in memory block is much smaller than the number of redundancy memory cell arrays, and there exists many unused redundancy memory cell arrays and redundancy circuits. The unused plural redundancy circuits unnecessarily consume the predetermined region of the highly integrated semiconductor memory device. The unnecessarily consumed region limits the integration of the highly integrated semiconductor memory device.

SUMMARY OF THE INVENTION

Accordingly, it is an object of the present invention to provide a redundancy circuit that can improve the integration of the highly integrated semiconductor memory device.

To achieve the object, the redundancy circuit of the present invention comprises at least two memory blocks, each memory block having a plurality of normal memory cell arrays and a redundancy memory cell array for replacing a defective memory cell array, at least two redundancy cell array driving means respectively connected to at least two redundancy memory cell arrays for driving at least two redundancy memory cell arrays, a defective-cell-array detection fuse box for detecting address corresponding to the defective memory cell array, a block selection fuse box for selecting the plurality of memory blocks, and driving control means for driving one among at least two redundancy cell array driving means.

BRIEF DESCRIPTION OF THE DRAWINGS

The above objects and other advantage of the present invention will become more apparent by describing the preferred embodiment of the present invention with reference to the attached drawings, in which.

DETAILED DESCRIPTION OF THE INVENTION

Figure 1:
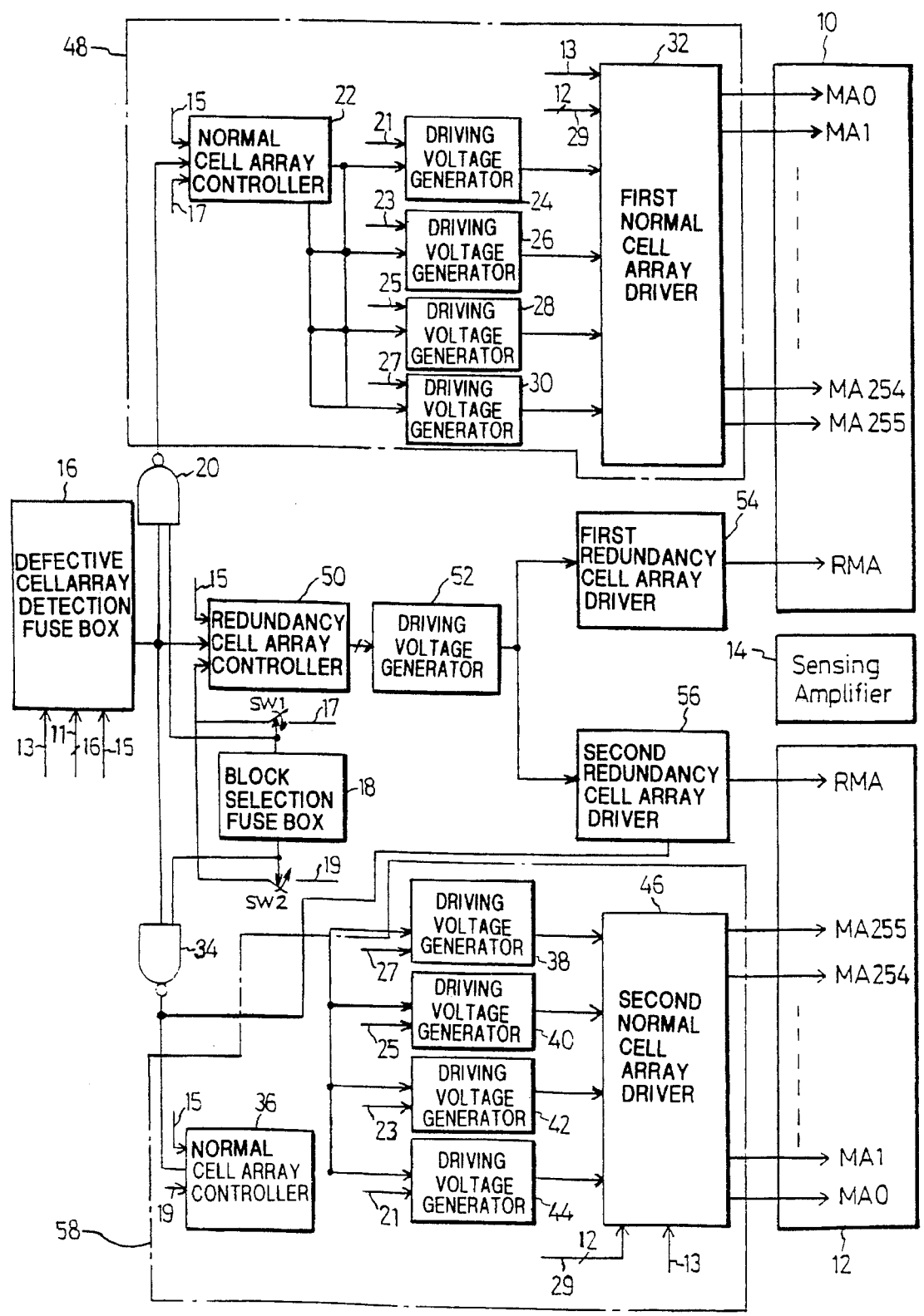
FIG. 1 is a block diagram of a row redundancy circuit according to an embodiment of the present invention.

Turning now to FIG. 1, a row redundancy circuit according to an embodiment of the present invention which has first and second memory blocks 10 and 12, and a defective-cell-array detection fuse box 16 for receiving 8-bit address signals A0 to A7 from an address bus 11 is illustrated. Each of first and second memory blocks 10 and 12 has 256 memory cell arrays MA0 to MA255 and a redundancy memory cell array RMA. The defective-cell-array detection fuse box 16 generates a redundancy mode selection signal having high logic, when the 8-bit address signals A0 to A7 have the same logic value as the address of defective cell arrays programmed by a manufacturer. While a pre-charge signal of high logic is supplied from a first control line 13, the defective-cell-array detection fuse box 16 generates a redundancy mode selection signal having low or high logic according to the logic value of the 8-bit address signals A0 to A7. Also, the defective-cell-array detection fuse box 16 is driven by a driving signal from a second control line 15. The address programmed in the defective-cell-array detection fuse box 16 has a logic value of row address of the defective memory cell array generated in the first memory block 10 or the second memory block 12. The 8-bit address signals A0 to A7 include true address signal and complementary address signal, and are supplied to the defective-cell-array detection fuse box 16 via the address bus 11 from an address buffer (not shown).

The row redundancy circuit additionally has a redundancy cell array controller 50 for receiving the redundancy mode selection signal, and a block selection fuse box 18 for selecting the driving of the redundancy memory cell arrays RMA within the first and second memory cell blocks 10 and 12. The block selection fuse box 18 generates first and second block selection signals having opposite logics with each other, according to the state previously set by the manufacturer, and supplies the first and second block selection signals to the first and second controlling switches SW1 and SW2. The first block selection signal has a high logic, to drive the redundancy memory cell array RMA within the first memory block 10, and a low logic, to drive the redundancy memory cell array RMA within the second memory block 12. To generate the first and second block selection signals, two fuses programmable by the manufacturer are provided. The first controlling switch SW1 supplies a block enable signal from the third control line 17 to the redundancy cell array controller 50, when the first block selection signal from the block selection fuse box 18 has high logic. Meanwhile, when the second block selection signal has high logic, the second controlling switch SW2 supplies the second block enable signal from the fourth control line 19 to the redundancy cell array controller 50. Accordingly, the first and second controlling switches SW1 and SW2, maintaining opposite switching states, supply to the redundancy cell array controller 50 a first block enable signal from the third control line 17 or a second block enable signal from the fourth control line 19 according to logic values of the first and second block selection signals from the block selection fuse box 18. When all of the redundancy mode selection signal from the defective-cell-array detection fuse box 16, and the first block enable signal from the first controlling switch SW1 or the second block enable signal from the second controlling switch SW2 have high logic, the redundancy cell array controller 50 generates a redundancy strobe signal of high logic. The redundancy cell array controller 50 receives a driving signal from the second control line 15 and is operated when the driving signal has high logic. The high logic redundancy strobe signal makes a driving voltage generator 52 generate a driving voltage signal.

Also, the row redundancy circuit has a first NAND gate 20 for receiving the first block selection signal from the block selection fuse box 18 and the redundancy mode selection signal the defective-cell-array detection fuse box 16, and a second NAND gate 34 for receiving the second block selection signal and the redundancy mode selection signal from the first block selection fuse box 18 and the defective-cell-array detection fuse box 16. The first NAND gate 20 inverts the redundancy mode selection signal when the first block selection signal has high logic. The first NAND gate 20 supplies the inverted redundancy mode selection signal to the first redundancy cell array driver 54 and the first normal cell array driver 48, which are then complementarily driven. While the inverted redundancy mode selection signal from the first NAND gate 20 has low logic, the first redundancy cell array driver 54 supplies the driving voltage signal from the driving voltage generator 52 to the redundancy memory cell array RMA of the first memory block 10, to drive the redundancy memory cell array RMA within the first memory block 10 instead of the defective memory cell array. Meanwhile, when the first block selection signal has low logic, the first NAND gate 20 supplies a logic signal of high logic to the first normal cell array driver 48 and the first redundancy cell array driver 54, and accordingly, the first normal cell array driver 48 is always driven. At this time, the first redundancy cell array driver 54 and the first redundancy memory cell array RMA within the first memory block 10 are not used.

Similarly, when the second block selection signal has high logic, the second NAND gate 34 also supplies the inverted redundancy mode selection signal to the second normal cell array driver 58 and the second redundancy cell array driver 56, so that the second normal cell array driver 58 and the second redundancy cell array driver 56 are complementarily driven. While the inverted redundancy mode selection signal from the second NAND gate 34 has low logic, the second redundancy cell array driver 56 supplies the driving voltage signal from the driving voltage generator 52 to the redundancy memory cell array RMA of the second memory block 12, so that the redundancy memory cell array RMA within the second memory block 12 is driven instead of the defective memory cell array. Contrarily, when the second block selection signal has low logic, the second NAND gate 34 supplies a logic signal of high logic to the second normal cell array driver 58 and the second redundancy cell array driver 56, so that the second normal cell array driver 58 are always driven, but the second redundancy cell array driver 56 and the redundancy memory cell array RMA within the second memory block 12 are not driven. Accordingly, the first and second NAND gates 20 and 34 function to selectively drive the first redundancy cell array driver 54 and the second redundancy cell array driver 56 according to logic values of the first and second block selection signals.

The first normal cell array driver 48 driven by logic signal of high logic or the inverted redundancy mode selection signal from the first NAND gate 20 has a normal cell array controller 22 for receiving an output signal of the first NAND gate 20, and a driving signal and a first block enable signal from the second and third control lines 15 and 17. When all of the output signal of the first NAND gate 20, driving signal, and first block enable signal have high logic, the normal cell array controller 22 generates a normal strobe signal of high logic, and supplies the normal strobe signal to four driving voltage generators 24 to 30. The four driving voltage generators 24 to 30 are selectively driven by the logic values of first to fourth address decoding signals from the fifth to eighth control lines 21 to 27, and generate a driving voltage signal for driving a normal memory cell array. When the normal strobe signal and the first address decoding signal have high logic, the driving voltage generator 24 generates a driving voltage signal for driving (4n+0)-th memory cell arrays MA0, MA4, ..., MA252 within the first memory block. When the normal strobe signal and the second address decoding signal have high logic, the driving voltage generator 26 generates a driving voltage signal for driving (4n+1)-th memory cell arrays MA1, MA5, ..., MA253 within the first memory block 10. When the normal strobe signal and the third address decoding signal have high logic, the driving voltage generator 28 generates a driving voltage signal for driving the (4n+2)-th memory cell arrays MA2, MA6, ..., MA254 within the first memory block 10. When the normal strobe signal and the fourth address decoding signal have high logic, the driving voltage generator 30 generates a driving voltage signal for driving the (4n+3)-th memory cell arrays MA3, MA7, ..., MA255 within the first memory block 10. The first to fourth address decoding signals have specific logic (for example, high or low logic), when least and next-least significant complementary address signals /A0 and /A1, least significant true address signal A0 and next-least significant complementary address signal /A1, least significant complementary address signal /A0 and next-least significant true address signal A1, and least and next-least significant true address signals A0 and A1 have high logic, respectively. The first normal cell array driver 32 selects 4n+0 to 4n+3 memory cell arrays within the first memory block 10 by a 12-bit fifth address decoding signal from a control bus 29. The first normal cell array driver 32 supplies the driving voltage signal to any one memory cell array among the selected 4n+0 to 4n+3 memory cell arrays, to drive memory cell array in the address corresponding to the logic value of the 8-bit address signals A0 to A7. Also, the first normal cell array driver 32 is operated by a pre-charge signal from the first control line 13.

The second normal cell array driver 58 receiving the output of the second NAND gate 34 and the second block enable signal from the fourth control line 19 drives a normal memory cell array within the second memory block 12 according to the logic values of the fifth to ninth address decoding signals. To do this, the second normal cell array driver 58 has a second normal cell array controller 36, a second normal cell array driver 46, and four driving voltage generators 38 to 44, which respectively have the same constitutions as those of the first normal cell array driver 48. The operation of the second normal cell array driver 58 having the same circuit components as those of the first normal cell array driver 48 is omitted. The sense amplifier 14 amplifies data stored in the first and second memory blocks 10 and 12, or amplifies data read out from the first and second memory blocks 10 and 12.

Figure 2:
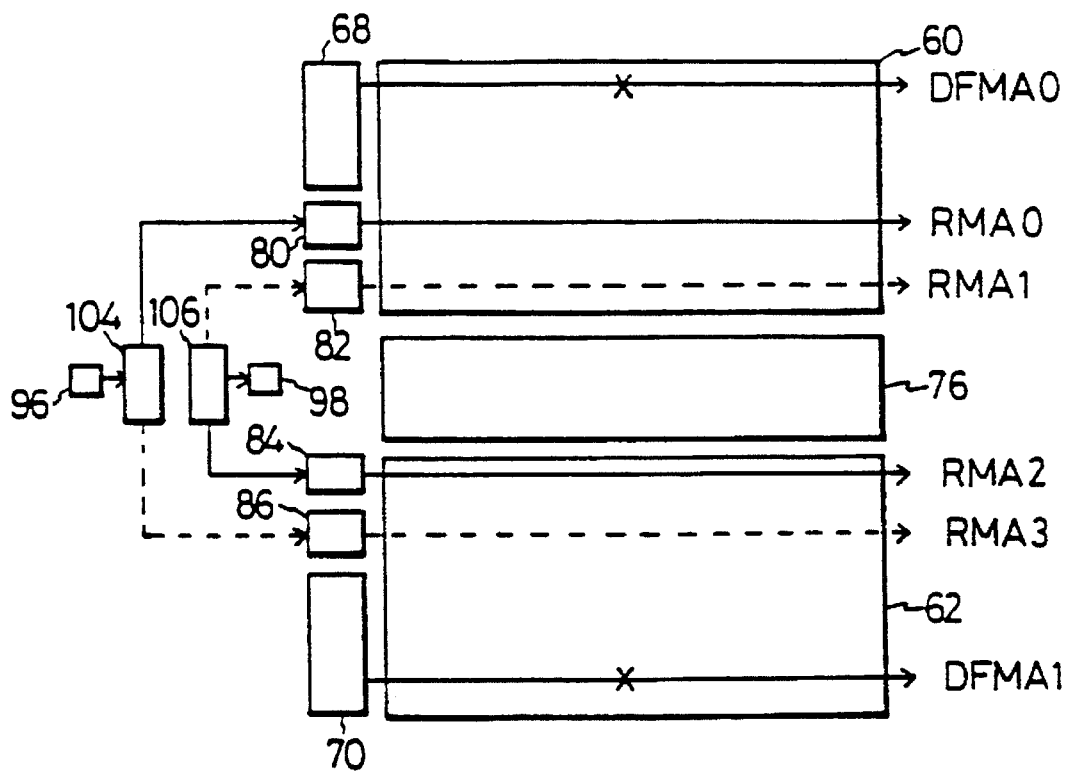
FIG. 2 is a schematic diagram of a highly integrated semiconductor memory device having two redundancy memory cell arrays per memory block where the row redundancy circuit according to the embodiment of the present invention is applied.
Figure 2:
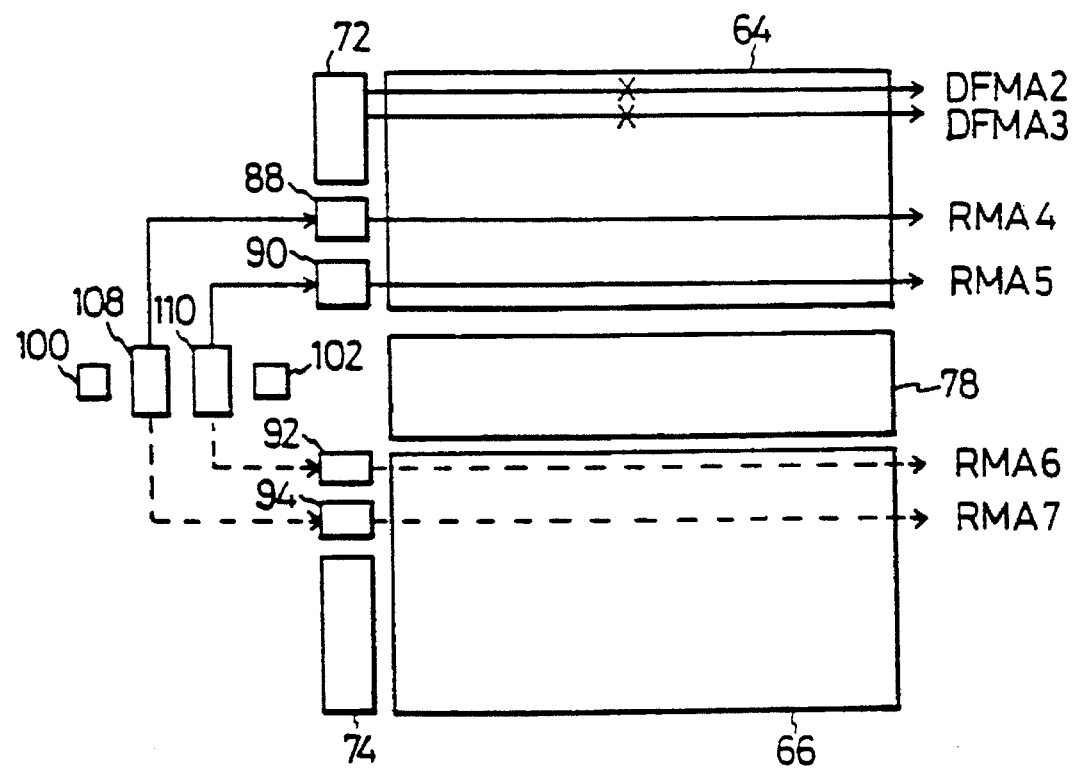

FIG. 2 illustrates a semiconductor memory device where the row redundancy circuit, according to the embodiment of the present invention, comprising first to fourth memory blocks 60 to 66, each having two redundancy memory cell arrays, four normal cell array drivers 68 to 74, and two sense amplifiers 76 and 78, is applied. The first redundancy memory cell array RMA0 within the first memory block 60 is used instead of the first defective memory cell array FDMA0 by the first block selection fuse box 96, the first cell array controller 104, and the redundancy cell array driver 82. The first redundancy memory cell array RMA2 within the first memory block 62 is used instead of the second defective memory cell array FDMA1 by the second block selection fuse box 98, the second cell array controller 106, and the redundancy cell array driver 84. Also, the first redundancy cell array RMA4 within the third memory block 64 driven by the third block selection fuse box 100, the third cell array controller 108, and the redundancy cell array driver 88, and the second redundancy memory cell array RMA5 within the third memory block 64 driven by the fourth block selection fuse box 102, the fourth cell array controller 110 and the redundancy cell array driver 90 are used instead of two memory cell arrays DFMA2 and DFMA3, respectively. Meanwhile, the second redundancy memory cell array RMA1 within the first memory block 60, the second redundancy memory cell array RMA3 within the second memory block 62, the first and second redundancy memory cell arrays RMA6 and RMA7 within the fourth memory block 66, and four redundancy cell array drivers 82, 84, 92 and 94 are not used. The first to fourth redundancy cell array controllers 104 to 110 include the first and second NAND gates 20 and 34, the first and second controlling switches SW1 and SW2, the defective-cell-array detection fuse box 16, the redundancy cell array controller 50, and the driving voltage generator 52, shown in FIG. 1.

Figure 3:
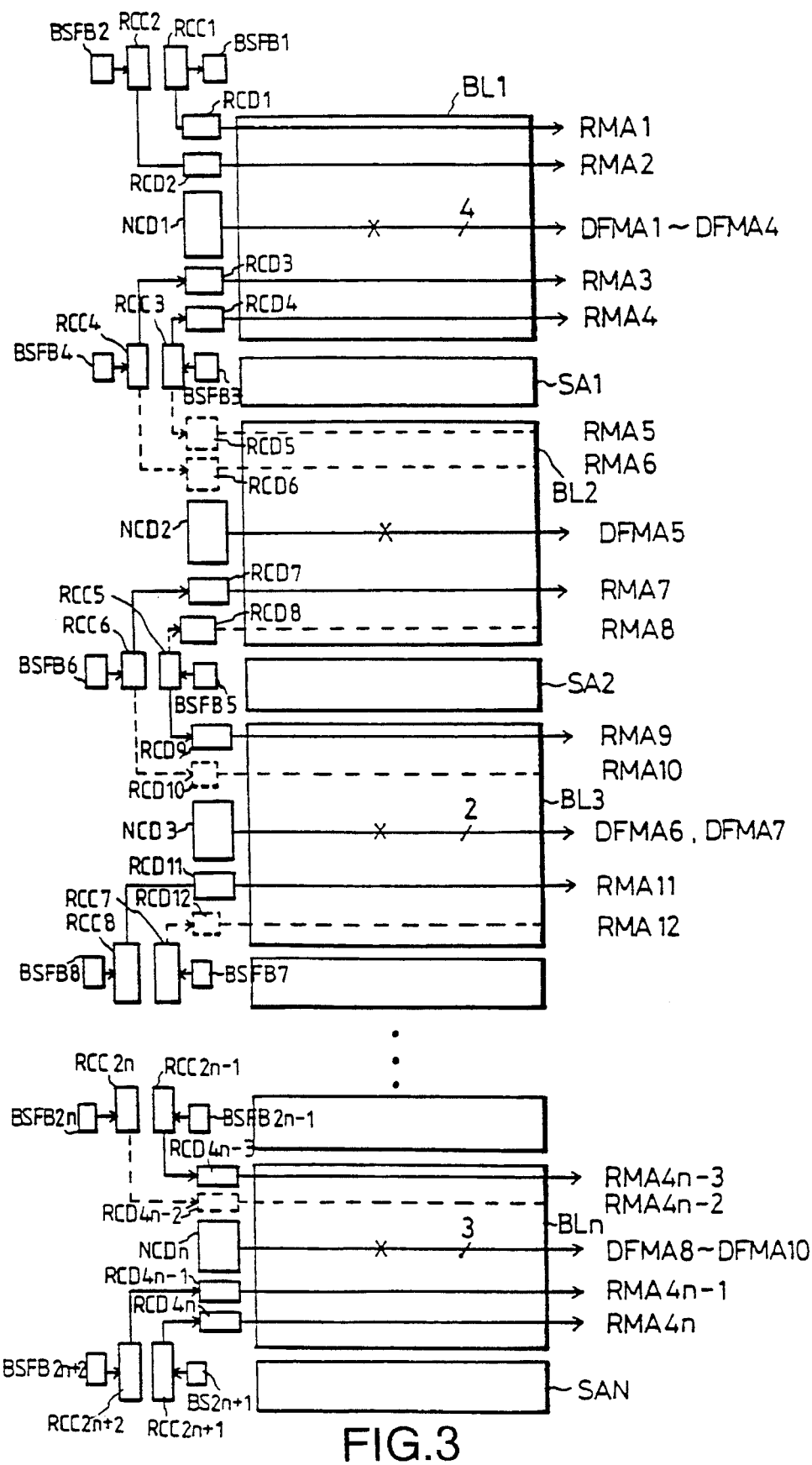
FIG. 3 is a schematic diagram of a highly integrated semiconductor memory device having four redundancy memory cell arrays per memory block where the row redundancy circuit according to the embodiment of the present invention is applied.

FIG. 3 is a block diagram of a semiconductor memory device where the row redundancy circuit, according to the embodiment of the present invention, comprising n memory blocks BL1 to BLn, each of which has four redundancy memory cell arrays RMA1 to RMA4n, n sense amplifiers SA1 to SAn, and n normal cell array drivers NCD1 to NCDn is applied. The semiconductor memory device shown in FIG. 3 has 2n+2 block selection fuse boxes BSFD1 to BSFD2n+2, 2n+2 redundancy cell array drivers RCC1 to RCC2n+2, and 4n redundancy cell array drivers RCD1 to RCD4n. In the semiconductor memory device, the redundancy memory cell arrays RMA1 to RMA4, RMA7, RMA9, RMA11, RMA4n-3, RMA4n-1 and RMA4n, indicated with the solid lines, are used instead of the defective memory cell arrays DFMA1 to DFMA10. However, the redundancy memory cell arrays RMA5, RMA6, RMA8 to RMA10, RMA12 and RMA4n-2, indicated with the dotted lines, are not used, and the redundancy cell array drivers RCD5, RCD6, RCD8 to RCD10, RCD12 and RCD4n-2, indicated with the dotted lines, are not driven.

As described above, the redundancy circuit of the present invention selectively drives two redundancy memory cell arrays to improve the efficiency of the redundancy circuit of the semiconductor memory device. Accordingly, the redundancy circuit of the present invention minimizes the unneeded space consumption of the semiconductor memory device and improves the integration of the semiconductor memory device.

What is claimed is:

1. In a semiconductor memory device having at least two memory blocks, each memory block having a plurality of normal memory cell arrays and a redundancy memory cell array for replacing a defective memory cell array, a redundancy circuit comprising:

at least two redundancy cell array driving means respectively connected to at least two said redundancy memory cell arrays for driving at least two said redundancy memory cell arrays of respective blocks;

a defective cell array detection fuse box for detecting address corresponding to said defective memory cell array;

a block selection fuse box for selecting one of said plurality of memory blocks; and driving control means for driving one of at least two said redundancy cell array driving means associated with said redundancy memory cell arrays of respective blocks by outputs of said defective cell array detection fuse box and said block selection fuse box.

2. A redundancy circuit as claimed in claim 1, wherein said block selection fuse box generates at least two block selection signals, and said driving control means comprises at least two logic elements for logic-operating said block selection signal and outputs of said defective-cell-array detection fuse box to supply a logic-operated signal to at least two said redundancy cell array driving means.

3. In a semiconductor memory device having at least two memory blocks, each memory block having a plurality of memory cell arrays and a redundancy memory cell array for replacing a defective memory cell array, a redundancy circuit comprising:

driving voltage generating means for generating a driving voltage to drive redundancy memory cell array of at least two said memory blocks;

at least two redundancy cell array driving means respectively connected between said driving voltage generating means and at least two said redundancy memory cell arrays for supplying said driving voltage signal to at least two said redundancy memory cell arrays;

a defective-cell-array detection fuse box for detecting address corresponding to said defective memory cell array;

a block selection fuse box for selecting said plurality of memory blocks; and driving control means for driving one of at least two said redundancy cell array driving means by outputs of said defective-cell-array detection fuse box and said block selection fuse box.

4. A redundancy circuit as claimed in claim 3, wherein said block selection fuse box generates at least two block selection signals, and said driving control means comprise at least two logic elements for logic-operating said block selection signal and outputs of said defective-cell-array detection fuse box to supply a logic-operated signal to at least two said redundancy cell array driving means.

5. A redundancy circuit as claimed in claim 4, further comprising voltage control means for controlling operation of said driving voltage generating means by an output of said defective-cell-array detection fuse box and logic value of at least two said block selection signals.

6. In a semiconductor memory device having at least two memory blocks, each memory block having a plurality of normal memory cell arrays and a redundancy memory cell array for replacing a defective memory cell array, a redundancy circuit comprising:

at least two redundancy cell array driving means respectively connected to at least two said redundancy memory cell arrays for driving at least two said redundancy memory cell arrays;

a defective cell array detection fuse box for detecting address corresponding to said defective memory cell array;

a block selection fuse box for selecting one of said plurality of memory blocks; and driving control means for driving one of at least two said redundancy cell array driving means by outputs of said defective cell array detection fuse box and said block selection fuse box;

wherein said block selection fuse box generates at least two block selection signals, and said driving control means comprises at least two logic elements for logic-operating said block selection signal and outputs of said defective-cell-array detection fuse box to supply a logic-operated signal to at least two said redundancy cell array driving means.

* * * * *